(12) United States Patent
Yamada

(10) Patent No.: US 10,692,982 B2
(45) Date of Patent: Jun. 23, 2020

(54) SEMICONDUCTOR APPARATUS

(71) Applicant: Murata Manufacturing Co., Ltd., Kyoto (JP)

(72) Inventor: Takashi Yamada, Kyoto (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 0 days.

(21) Appl. No.: 16/281,162

(22) Filed: Feb. 21, 2019

(65) Prior Publication Data
US 2019/0312115 A1 Oct. 10, 2019

(30) Foreign Application Priority Data

Apr. 4, 2018 (JP) ................. 2018-072456

(51) Int. Cl.
| | |
|---|---|
| *H03F 1/32* | (2006.01) |
| *H01L 29/417* | (2006.01) |
| *H03F 3/195* | (2006.01) |
| *H03F 3/213* | (2006.01) |
| *H01L 29/737* | (2006.01) |
| *H03F 1/56* | (2006.01) |
| *H03F 1/26* | (2006.01) |
| *H03F 3/24* | (2006.01) |

(52) U.S. Cl.
CPC .......... *H01L 29/417* (2013.01); *H01L 29/737* (2013.01); *H03F 1/26* (2013.01); *H03F 1/565* (2013.01); *H03F 3/195* (2013.01); *H03F 3/213* (2013.01); *H03F 3/245* (2013.01)

(58) Field of Classification Search
CPC ....................................................... H03F 1/32
USPC ........................................ 330/126, 295, 124 R
See application file for complete search history.

(56) References Cited

U.S. PATENT DOCUMENTS 6,298,244 B1 * 10/2001 Boesch ..................... H03H 7/38
330/126
7,148,751 B2 * 12/2006 Weigand ..................... H03F 1/30
330/307

(Continued)

FOREIGN PATENT DOCUMENTS

| JP | 2002-171137 A | 6/2002 |
| JP | 2006-245370 A | 9/2006 |

(Continued)

*Primary Examiner* — Henry Choe
(74) *Attorney, Agent, or Firm* — Pearne & Gordon LLP

(57) ABSTRACT

A semiconductor apparatus includes the following elements. A substrate includes a ground portion to which a ground potential is supplied. A semiconductor chip is mounted on the substrate and includes first and second output terminals, a first terminator, and a ground terminal. First and second amplifiers are respectively formed in first and second regions of the semiconductor chip and respectively amplify first and second input signals of first and second frequency bands and output first and second amplified signals from the first and second output terminals via first and second output wires. A first harmonic termination circuit includes a first wire which electrically connects the first terminator and the ground portion. A ground wire is disposed between the first wire and the second output wire in a plan view of a main surface of the semiconductor chip and electrically connects the ground terminal and the ground portion.

16 Claims, 7 Drawing Sheets

(56) References Cited

U.S. PATENT DOCUMENTS

| | | | |
|---|---|---|---|
| 7,471,146 B2* | 12/2008 | Macropoulos | H05K 1/024 257/499 |
| 2006/0139093 A1* | 6/2006 | Gagon | H03G 9/005 330/126 |
| 2018/0241355 A1 | 8/2018 | Shounai et al. | |
| 2019/0149094 A1* | 5/2019 | Arfaei Malekzadeh | H03F 3/265 |

FOREIGN PATENT DOCUMENTS

| | | |
|---|---|---|
| JP | 2009-239882 A | 10/2009 |
| JP | 2017-208729 A | 11/2017 |

\* cited by examiner

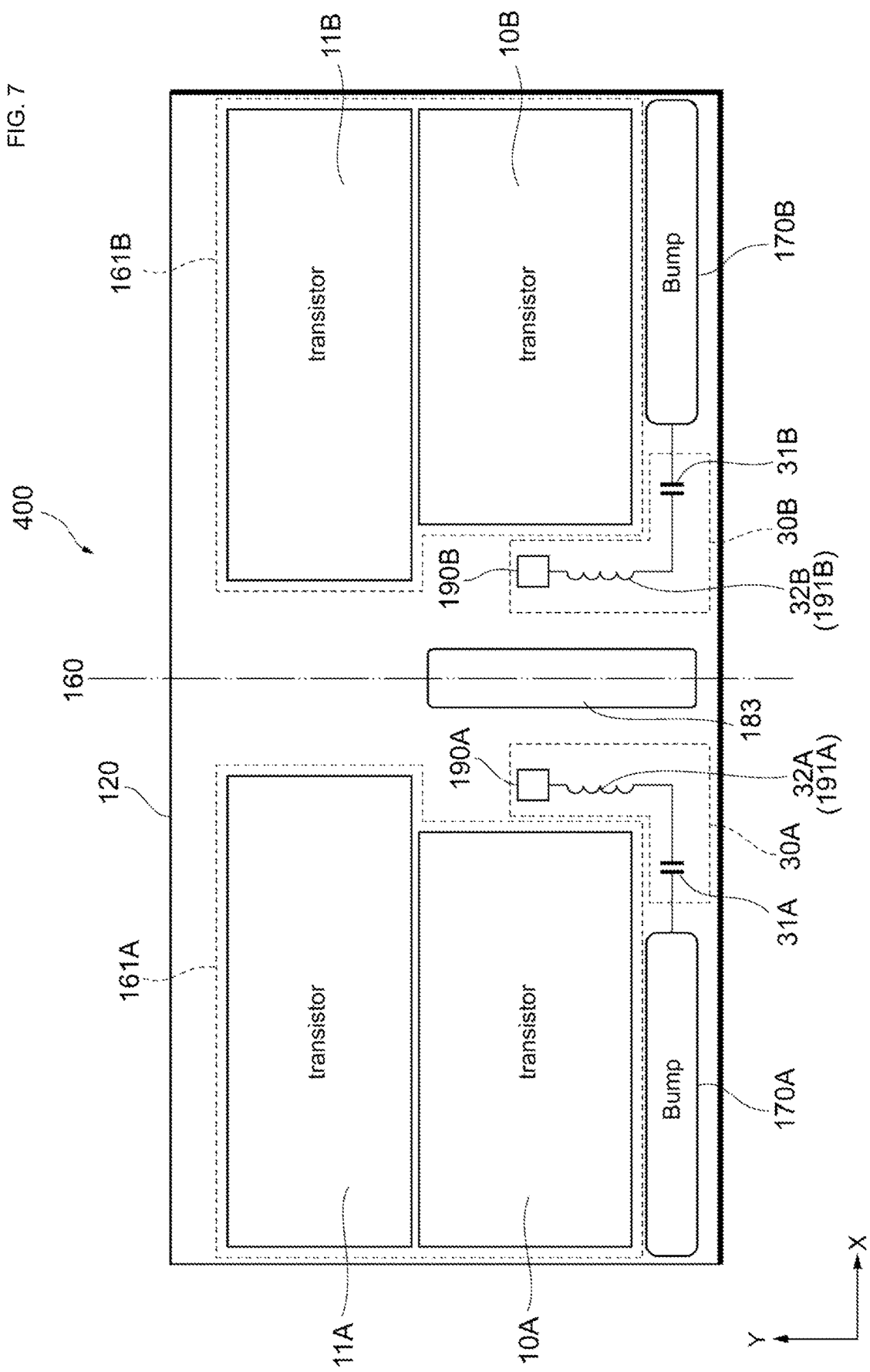

SEMICONDUCTOR APPARATUS

This application claims priority from Japanese Patent Application No. 2018-072456 filed on Apr. 4, 2018. The content of this application is incorporated herein by reference in its entirety.

BACKGROUND

The present disclosure relates to a semiconductor apparatus. In a mobile communication device, such as a cellular phone, a power amplifier module for amplifying power of a radio frequency (RF) signal to be transmitted to a base station is used. In the power amplifier module, a harmonic termination circuit is used to attenuate harmonic components (signal having a frequency of an integral multiple of the fundamental frequency) contained in an amplified signal output from an amplifier. For example, Japanese Unexamined Patent Application Publication No. 2002-171137 discloses an RF-signal transmit module including a harmonic termination circuit which short-circuits second-order harmonic components contained in an amplified signal to a ground.

BRIEF SUMMARY

In some of recent power amplifier modules, to reduce the chip area, plural amplification paths for amplifying signals of different frequency bands are disposed on the same chip. On such a chip, harmonic components, such as second-order wave components, leaking from a harmonic termination circuit disposed on one amplification path are more likely to leak into the other amplification path. In this case, if the frequency band of second-order waves of a signal flowing through one amplification path is close to that of the fundamental waves of a signal flowing through the other amplification path, the second-order waves may interfere with the signal flowing through the other amplification path. This may degrade the power amplification characteristics and the receive sensitivity in the other amplification path.

The present disclosure has been made in view of the above-described background. The present disclosure provides a semiconductor apparatus that is capable of reducing interference of signals between plural amplification paths.

According to an aspect of the present disclosure, there is provided a semiconductor apparatus including a substrate, a semiconductor chip, first and second amplifiers, a first harmonic termination circuit, and a ground wire. The substrate includes a ground portion to which a ground potential is supplied. The semiconductor chip is mounted on the substrate and includes first and second output terminals, a first terminator, and a ground terminal. The first amplifier is formed in a first region of the semiconductor chip and amplifies a first input signal of a first frequency band and outputs a first amplified signal from the first output terminal via a first output wire. The second amplifier is formed in a second region of the semiconductor chip and amplifies a second input signal of a second frequency band and outputs a second amplified signal from the second output terminal via a second output wire. The first harmonic termination circuit has frequency characteristics in which harmonic components contained in the first amplified signal are attenuated. The first harmonic termination circuit includes a first wire which electrically connects the first terminator of the semiconductor chip and the ground portion of the substrate. The ground wire is disposed between the first wire and the second output wire in a plan view of (viewed in a direction perpendicular to) a main surface of the semiconductor chip, and electrically connects the ground terminal of the semiconductor chip and the ground portion of the substrate.

According to another aspect of the present disclosure, there is provided a semiconductor apparatus including a semiconductor chip, first and second amplifiers, a first harmonic termination circuit, and a conductive portion. The semiconductor chip includes first and second output terminals and a ground portion. A ground potential is supplied to the ground portion. The first amplifier is formed in a first region of the semiconductor chip and amplifies a first input signal of a first frequency band and outputs a first amplified signal from the first output terminal. The second amplifier is formed in a second region of the semiconductor chip and amplifies a second input signal of a second frequency band and outputs a second amplified signal from the second output terminal. The first harmonic termination circuit has frequency characteristics in which harmonic components contained in the first amplified signal are attenuated. The first harmonic termination circuit includes a first wiring which electrically connects the first output terminal and the ground portion of the semiconductor chip. The conductive portion is disposed between the first wiring and the second output terminal in a plan view of a main surface of the semiconductor chip. A ground potential is supplied to the conductive portion.

According to an aspect of the present disclosure, it is possible to provide a semiconductor apparatus that is capable of reducing interference of signals between plural amplification paths.

Other features, elements, characteristics and advantages of the present disclosure will become more apparent from the following detailed description of preferred embodiments of the present disclosure with reference to the attached drawings.

BRIEF DESCRIPTION OF THE SEVERAL VIEWS OF THE DRAWINGS

FIG. 7 is a schematic plan view of a semiconductor apparatus according to a modified example of the second embodiment.

DETAILED DESCRIPTION

Figure 1:
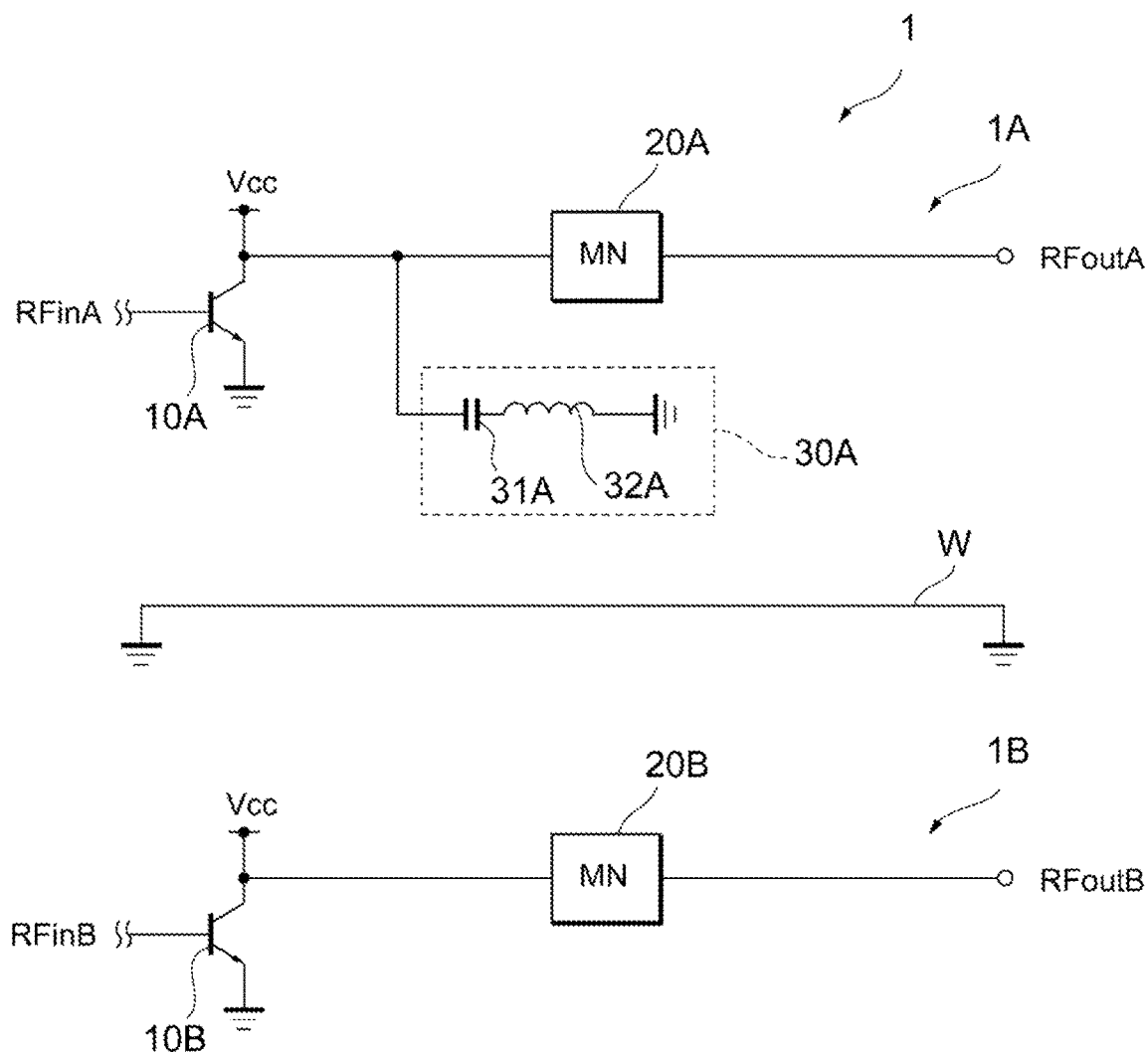
FIG. 1 is a circuit diagram of a power amplifier circuit included in a semiconductor apparatus according to a first embodiment of the disclosure.

Embodiments of the present disclosure will be described below in detail with reference to the accompanying drawings. The same element is designated by like reference numeral, and an explanation thereof will not be repeated.

FIG. 1 is a circuit diagram of a power amplifier circuit 1 included in a semiconductor apparatus 100 according to a first embodiment of the disclosure. The power amplifier circuit 1 shown in FIG. 1 is integrated in a cellular phone, for example, and is used for amplifying power of an RF signal to be transmitted to a base station. Examples of the communication standards of RF signals to be amplified by the power amplifier circuit 1 are the second generation (2G), the third generation (3G), the fourth generation (4G), the fifth generation (5G), Long Term Evolution (LTE)-Frequency Division Duplex (FDD), LTE-Time Division Duplex (TDD), LTE-Advanced, and LTE-Advanced Pro. However, the communication standards of RF signals to be amplified by the power amplifier circuit 1 are not limited to these standards.

The power amplifier circuit 1 has two amplification paths. The frequency band of RF signals amplified in one amplification path and that in the other amplification path are different from each other. Specific examples of the two amplification paths are a first path 1A for amplifying RF signals of a low band (first frequency band) and a second path 1B for amplifying RF signals of a middle band (second frequency band). The power amplifier circuit 1 includes a conductive portion W having a ground potential provided between the first and second paths 1A and 1B. The frequency bands of RF signals supplied to the first and second paths 1A and 1B are only examples and are not restricted to a low band and a middle band. A combination of the frequency bands of RF signals supplied to the first and second paths 1A and 1B may be a middle band and a high band or a low band and a high band. Alternatively, a combination of different communication standards, such as LTE and 5G or 4G and 5G, may be used.

The first path 1A includes a transistor 10A, a matching circuit 20A, and a harmonic termination circuit 30A. The second path 1B includes a transistor 10B and a matching circuit 20B.

The transistors 10A and 10B (first and second amplifiers) each amplify an RF signal. In the first embodiment, the transistors 10A and 10B are bipolar transistors, such as heterojunction bipolar transistors (HBTs).

In the transistor 10A, a power supply voltage Vcc is supplied to the collector, an input signal RFinA (first input signal) of a low band is supplied to the base, and the emitter is grounded. The transistor 10A amplifies the input signal RFinA and outputs an amplified signal RFoutA (first amplified signal) from the collector to the outside via the matching circuit 20A. In the transistor 10B, a power supply voltage Vcc is supplied to the collector, an input signal RFinB (second input signal) of a middle band is supplied to the base, and the emitter is grounded. The transistor 10B amplifies the input signal RFinB and outputs an amplified signal RFoutB (second amplified signal) from the collector to the outside via the matching circuit 20B.

A bias current or a bias voltage is supplied from a bias circuit to the base of each of the transistors 10A and 10B, though it is not shown. Each of the first and second paths 1A and 1B may include two stages of transistors or three or more stages of transistors to amplify power of an RF signal multiple times. In this case, the transistors 10A and 10B shown in FIG. 1 correspond to the final stage of transistors, for example. The transistors 10A and 10B may be field-effect transistors, such as metal-oxide-semiconductor field-effect transistors (MOSFETs), instead of bipolar transistors.

In this case, the collector, base, and emitter of a bipolar transistor are replaced by the drain, gate, and source of an FET.

The matching circuits (also called matching networks (MNs)) 20A and 20B respectively perform impedance matching between the output impedance of the transistors 10A and 10B and the impedance of circuits disposed subsequent to the matching circuits 20A and 20B. The matching circuits 20A and 20B may be constituted by capacitors, inductors, or distributed lines, though they are not restricted thereto.

The harmonic termination circuit 30A (first harmonic termination circuit) has frequency characteristics in which harmonic components contained in the amplified signal RFoutA output from the collector of the transistor 10A are attenuated. More specifically, the harmonic termination circuit 30A includes a capacitor 31A and an inductor 32A connected in series with each other between the collector of the transistor 10A and a ground portion, which will be discussed later. That is, the harmonic termination circuit 30A includes an LC series resonance circuit, and the impedance of the harmonic termination circuit 30A becomes low for components having the resonant frequency $f=1/2\pi\sqrt{LC}$ (Hz) which is determined by the capacitance C of the capacitor 31A and the self-inductance L of the inductor 32A. The constants of the capacitor 31A and the inductor 32A are set so that the resonant frequency f will substantially coincide with the frequency of N-order (N is an integer or two or greater) waves of a low-band amplified signal. This makes the harmonic termination circuit 30A serve as an attenuator which attenuates N-order wave components in the signal line. A description will be given below, assuming that the harmonic termination circuit 30A attenuates second-order wave components. The transmit frequency band of a low-band signal is about 699 to 915 MHz, and thus, the frequency band of second-order waves is about 1398 to 1830 MHz. The resonant frequency f may not necessarily exactly match the frequency of N-order waves of an amplified signal, and may have an allowance of ±about 20% of an integral multiple of the fundamental frequency.

The frequency band of a middle-band signal amplified in the second path 1B is about 1.5 to 2.7 GHz. Accordingly, the frequency band of second-order waves of a low-band signal amplified in the first path 1A is contained within or near the frequency band of the fundamental waves of a middle-band signal amplified in the second path 1B.

In the power amplifier circuit 1, to reduce the chip area, the first and second paths 1A and 1B for amplifying signals of different frequency bands are disposed on the same chip. As discussed above, the frequency band of second-order waves of a signal flowing through the first path 1A is close to that of the fundamental waves of a signal flowing through the second path 1B. If, while the first path 1A is operating, second-order wave components of a low-band signal leak from the harmonic termination circuit 30A disposed in the first path 1A into the second path 1B, they may interfere with a signal flowing through the second path 1B. In the first embodiment, however, the conductive portion W is provided between the first and second paths 1A and 1B so as to reduce a leakage of harmonic components. The arrangement of the components of the semiconductor apparatus 100 will be discussed below.

Figure 2:
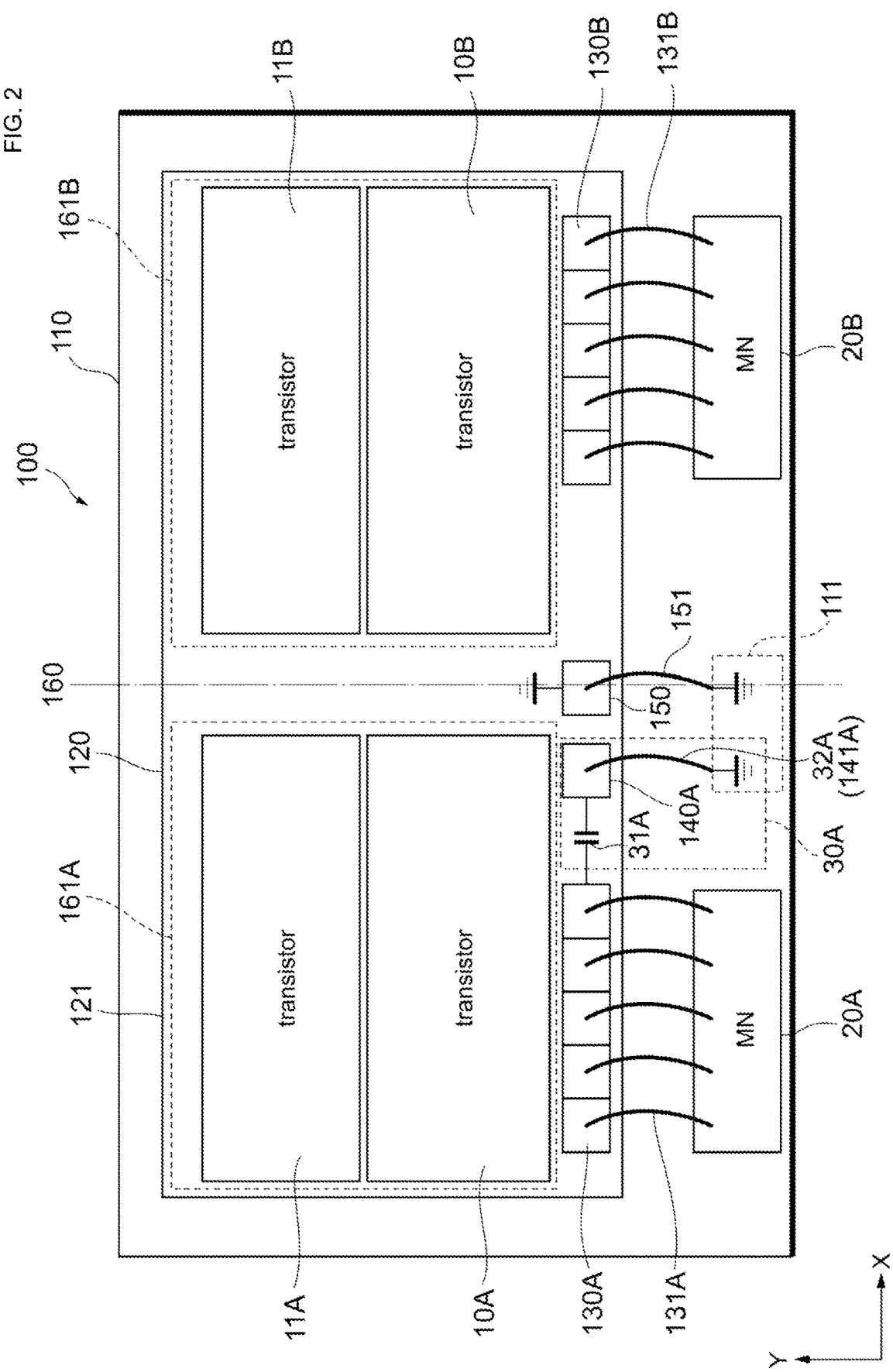
FIG. 2 is a schematic plan view of the semiconductor apparatus according to the first embodiment.

FIG. 2 is a schematic plan view of the semiconductor apparatus 100 according to the first embodiment. The semiconductor apparatus 100 shown in FIG. 2 includes a substrate 110 and a semiconductor chip 120 mounted on the substrate 110. In the following description, components corresponding to those included in the power amplifier circuit 1 shown in FIG. 1 are designated by like reference numerals, and an explanation thereof will be omitted.

The substrate 110 is used for mounting the semiconductor chip 120, which will be discussed below, and various other elements thereon. The substrate 110 includes one or plural ground portions 111. Although the ground portion 111 is indicated by a circuit symbol in FIG. 2, it is constituted by a ground electrode on the substrate 110 to which a ground potential is supplied.

The semiconductor chip 120 is a chip on which the transistors included in the power amplifier circuit 1 are formed by using a semiconductor process. The semiconductor chip 120 has a main surface 121 which is formed in a substantially rectangular shape and which is parallel with an XY plane defined by the X axis and the Y axis perpendicular to each other. In the first embodiment, the semiconductor chip 120 is connected to individual terminals provided on the substrate 110 by wire bonding so as to be connected to wiring patterns of the substrate 110. Specifically, the semiconductor chip 120 includes transistors 10A, 10B, 11A, and 11B, plural output terminals 130A and 130B, a terminator 140A, and a ground terminal 150.

The transistors 10A and 10B are the final stage of amplifiers in the power amplifier circuit 1, as shown in FIG. 1. The transistors 11A and 11B are amplifiers disposed at a stage preceding the transistors 10A and 10B, though they are not shown in FIG. 1. A description will be given below, assuming that the transistors 11A and 11B are the first stage of transistors and the transistors 10A and 10B are the second stage of transistors.

In a plan view of the main surface 121 of the semiconductor chip 120 (hereinafter may also simply be called "in a plan view of the semiconductor chip 120"), the transistors 11A and 10A in the first path 1A and the transistors 11B and 10B in the second path 1B are disposed symmetrically to each other with respect to a center line 160 which is parallel with the Y axis. More specifically, in a plan view of the semiconductor chip 120, the transistors 11A and 10A in the first path 1A are formed in a region 161A (first region) on one side (on the negative side of the X axis in FIG. 2) with respect to the center line 160. Within the region 161A, the transistor 10A of the second stage is located on the negative side of the Y axis with respect to the transistor 11A of the first stage. In a plan view of the semiconductor chip 120, the transistors 11B and 10B in the second path 1B are formed in a region 161B (second region) on the other side (on the positive side of the X axis in FIG. 2) with respect to the center line 160. Within the region 161B, the transistor 10B of the second stage is located on the negative side of the Y axis with respect to the transistor 11B of the first stage. Each of the transistors 10A, 10B, 11A, and 11B may be constituted by a transistor set including plural unit transistors connected in parallel with each other, though such a configuration is not shown. One unit transistor is a minimum configuration that can serve as a transistor.

On the negative side of the Y axis with respect to the transistors 10A and 10B of the second stage, the plural output terminals 130A (first output terminal) and the plural output terminals 130B (second output terminal), respectively, are formed. Amplified signals are output to outside the semiconductor chip 120 via the output terminals 130A and 130B. The plural output terminals 130A and 130B are arranged along one side of the semiconductor chip 120 on the negative side of the Y axis. The collector of the transistor 10A is electrically connected to the plural output terminals 130A, while the collector of the transistor 10B is electrically connected to the plural output terminals 130B. The plural output terminals 130A extend to outside the semiconductor chip 120 by using plural wires 131A (first output wire) and are electrically connected to part of the matching circuit 20A provided on the substrate 110. The plural output terminals 130B extend to outside the semiconductor chip 120 by using plural wires 131B (second output wire) and are electrically connected to part of the matching circuit 20B provided on the substrate 110. With this configuration, the amplified signal RFoutA of a low band is output from the output terminals 130A via the wires 131A, while the amplified signal RFoutB in a middle band is output from the output terminals 130B via the wires 131B. In the first embodiment, the plural wires 131A and 131B extend in parallel with each other along the Y axis.

As discussed above, the harmonic termination circuit 30A attenuates harmonic components contained in an amplified signal output from the collector of the second stage of the transistor 10A in the first path 1A. In the first embodiment, the harmonic termination circuit 30A is disposed in the vicinity of the center line 160 on the negative side of the Y axis with respect to the region 161A. The harmonic termination circuit 30A includes a terminator 140A (first terminator). The terminator 140A and the plural output terminals 130A are arranged side by side in the first path 1A.

The capacitor 31A is connected at one end to one of the plural output terminals 130A (output terminal closest to the center line 160 in FIG. 2) and at the other end to the terminator 140A. Although the capacitor 31A is represented by a symbol in FIG. 2, it is constituted by, for example, multiple metal layers overlaid on each other within the semiconductor chip 120. The inductor 32A is connected at one end to the terminator 140A and at the other end to the ground portion 111 on the substrate 110. The inductor 32A is constituted by a wire 141A (first wire) having inductance components.

The ground terminal 150 is disposed between the regions 161A and 161B on the semiconductor chip 120. The ground terminal 150 is disposed near the center line 160 in FIG. 2. When the semiconductor chip 120 is mounted on the substrate 110, the ground terminal 150 is electrically connected to the ground portion 111 on the substrate 110 so that a ground potential is supplied from the ground portion 111 to the ground terminal 150.

In the semiconductor apparatus 100, a ground wire 151 corresponding to the conductive portion W in FIG. 1 is provided. One end of the ground wire 151 is connected to the ground terminal 150 on the semiconductor chip 120 and is electrically connected to a ground portion on the substrate 110 via the ground terminal 150. The other end of the ground wire 151 is connected to the ground portion 111 on the substrate 110. With this configuration, a ground potential is supplied to both ends of the ground wire 151 so as to allow the ground wire 151 to serve the function of shielding the first and second paths 1A and 1B from each other. In a plan view of the semiconductor chip 120, the ground wire 151 is disposed between the wire 141A extending from the terminator 140A of the harmonic termination circuit 30A and the plural wires 131B extending from the plural output terminals 130B in the second path 1B. "The ground wire 151 is disposed between the wire 141A and the wires 131B" refers to that the ground wire 151 crosses a line connecting at least part of the wire 141A and at least part of a wire 131B, in a plan view of the main surface 121 of the semiconductor chip 120. The wire 141A, the ground wire 151, and the plural wires 131B extend in parallel with each other along the Y axis. The length in the extending direction (Y-axis direction)

of the ground wire 151 is preferably longer than the lengths in the extending direction (Y-axis direction) of the wire 141A and the plural wires 131B. The ground wire 151 is thus able to separate the wire 141A and the plural wires 131B from each other while keeping a ground potential so as to reduce coupling between the wire 141A and the plural wires 131B. The length in the extending direction of the ground wire 151 may be shorter than that of the wire 141A.

As discussed above, in the semiconductor apparatus 100, it is possible to reduce coupling between the wire 141A of the harmonic termination circuit 30A in the first path 1A and the plural wires 131B in the second path 1B. This reduces a leakage of second-order wave components from the wire 141A into the plural wires 131B. In the semiconductor apparatus 100, it is thus less likely to cause interference of signals between plural amplification paths, thereby reducing the degradation of the power amplification characteristics and the receive sensitivity in the second path 1B.

Figure 3:
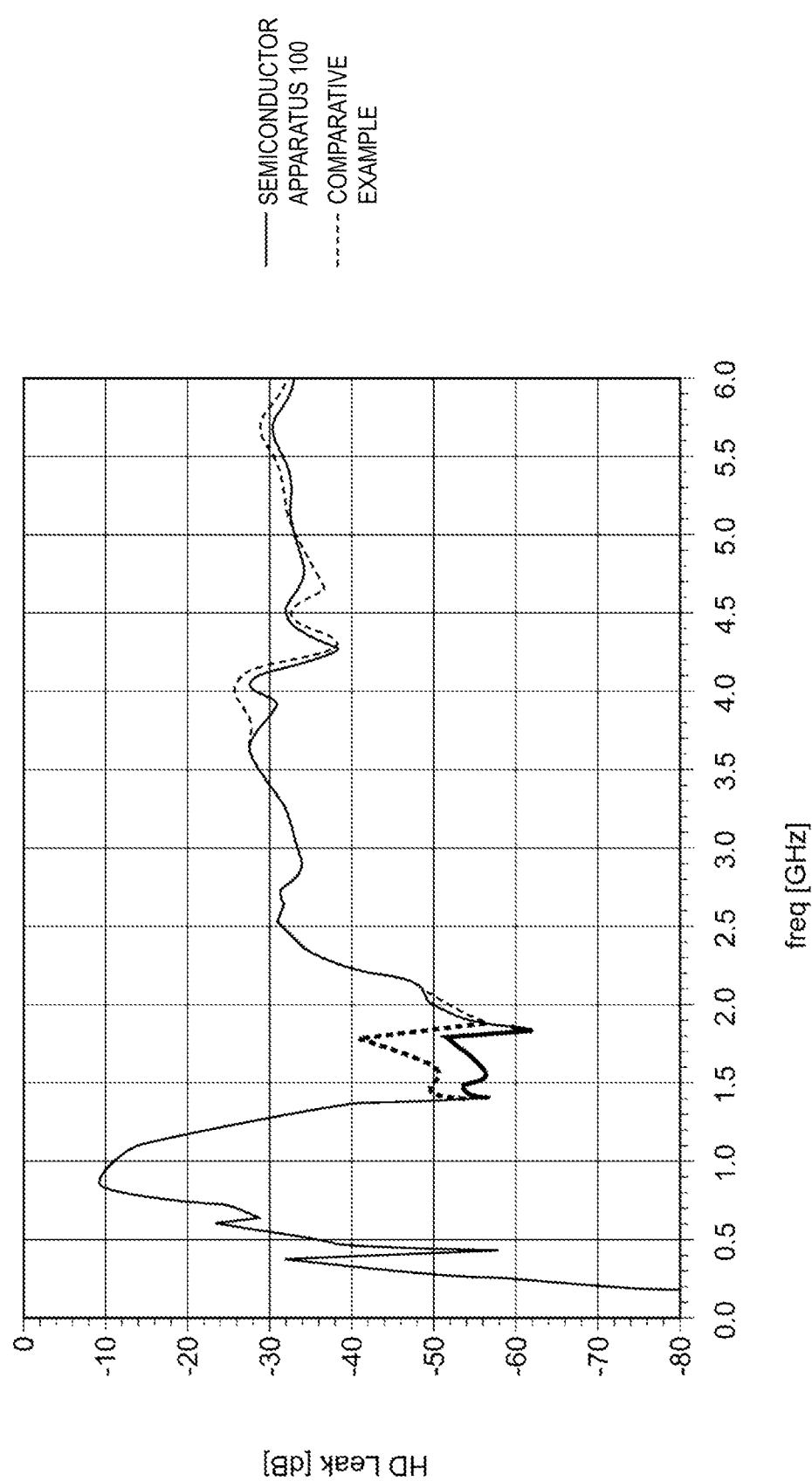
FIG. 3 is a graph illustrating the simulation results of a leakage of harmonic components in the semiconductor apparatus of the first embodiment and those of a comparative example.

FIG. 3 is a graph illustrating the simulation results of a leakage of harmonic components in the semiconductor apparatus 100 of the first embodiment and those of a comparative example. This graph shows the simulation results of a leakage of harmonic components observed in output in the second path 1B in relation to input in the first path 1A in the power amplifier circuit 1 shown in FIG. 1. As the comparative example, the semiconductor apparatus 100 shown in FIG. 2 without necessarily the ground wire 151 being used. In the graph, the horizontal axis indicates the frequency (GHz), while the vertical axis indicates the S parameter $S_{21}$ (dB). In the first embodiment and the comparative example, the first path 1A amplifies signals of a low band (transmit band of fundamental waves is about 699 to 915 MHz and that of second-order waves is about 1398 to 1830 MHz). In the graph, the frequency range of the second-order waves is indicated by the thick solid line.

FIG. 3 shows that a sharp rise in leakage is locally observed in the frequency band of the second-order waves in the comparative example. In contrast, a leakage in the frequency band of the second-order waves is smaller than that in the comparative example. It is thus validated that the provision of the ground wire 151 reduces a leakage of second-order wave components.

Figure 4:
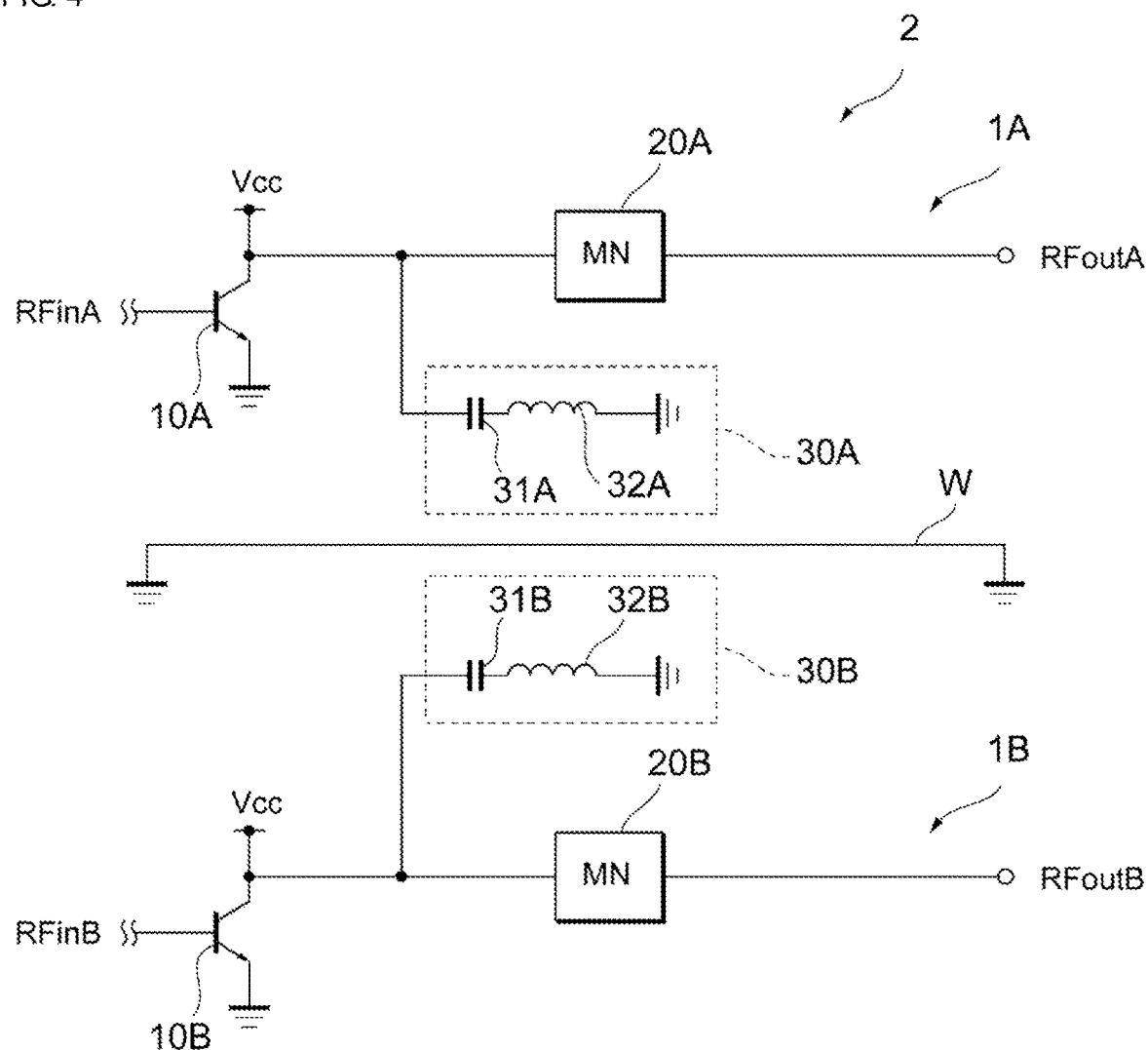
FIG. 4 is a circuit diagram of a power amplifier circuit included in a semiconductor apparatus according to a modified example of the first embodiment.

FIG. 4 is a circuit diagram of a power amplifier circuit 2 included in a semiconductor apparatus 200 according to a modified example of the first embodiment. The same elements as those of the power amplifier circuit 1 shown in FIG. 1 are designated by like reference numerals, and an explanation thereof will be omitted. The modified example of the first embodiment, a second embodiment, and a modified example of the second embodiment will be discussed below mainly by referring to points different from the first embodiment while omitting the same points as those of the first embodiment. An explanation of similar advantages obtained by similar configurations will not be repeated.

The power amplifier circuit 2 in FIG. 4 is different from the power amplifier circuit 1 in FIG. 1 in that the second path 1B includes a harmonic termination circuit 30B.

As in the harmonic termination circuit 30A, the harmonic termination circuit 30B (second harmonic termination circuit) has frequency characteristics in which harmonic components contained in the amplified signal RFoutB output from the collector of the transistor 10B are attenuated. More specifically, the harmonic termination circuit 30B includes a capacitor 31B and an inductor 32B connected in series with each other between the collector of the transistor 10B and a ground portion. The principle of the harmonic termination circuit 30B is similar to that of the harmonic termination circuit 30A, and a detailed explanation thereof will be omitted.

Figure 5:
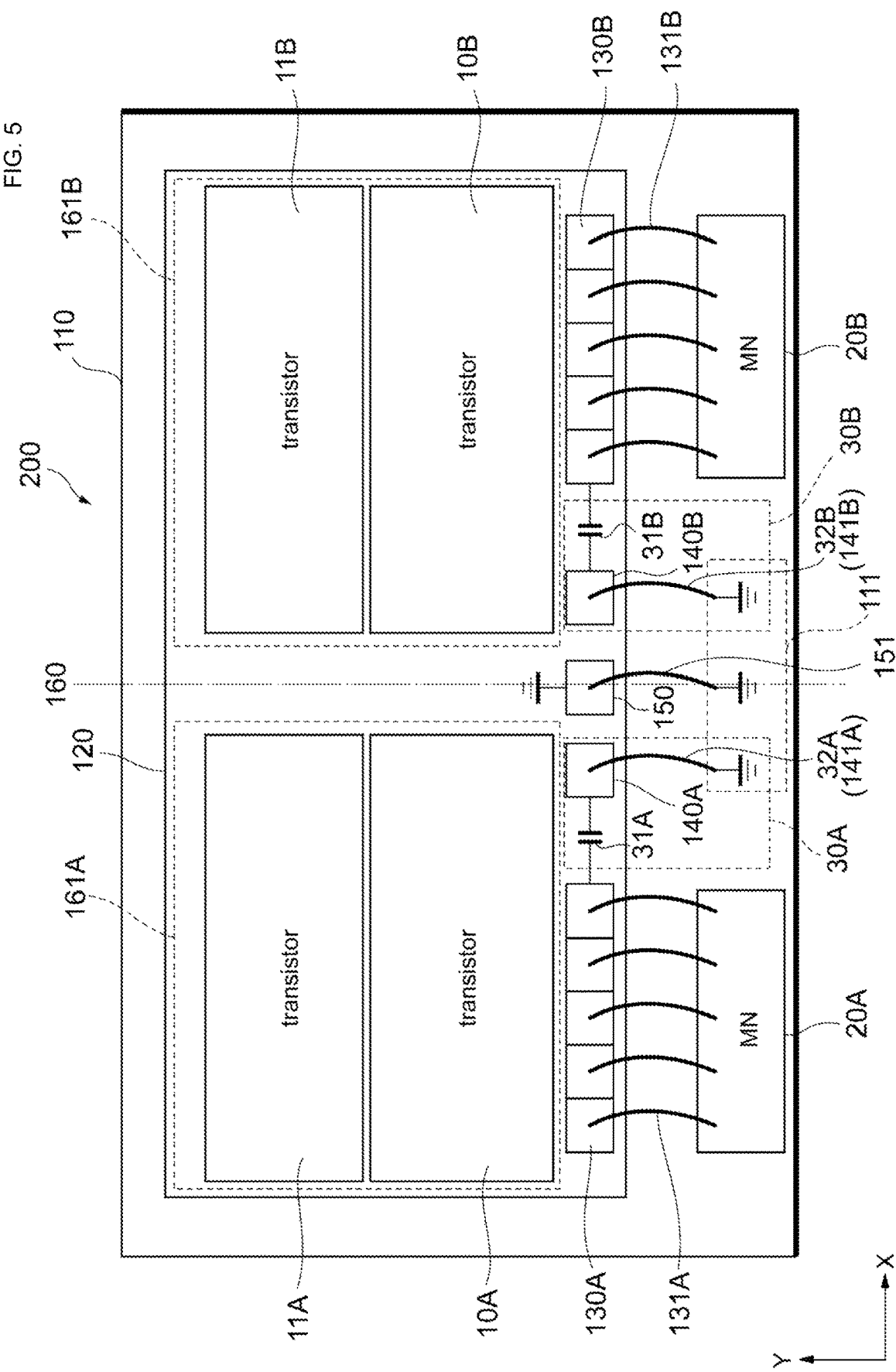
FIG. 5 is a schematic plan view of the semiconductor apparatus according to the modified example of the first embodiment.

FIG. 5 is a schematic plan view of the semiconductor apparatus 200 according to the modified example of the first embodiment. The semiconductor apparatus 200 shown in FIG. 5 is different from the semiconductor apparatus 100 in FIG. 2 in that, in addition to the harmonic termination circuit 30A, the harmonic termination circuit 30B is formed on the substrate 110 and the semiconductor chip 120.

In a plan view of the semiconductor chip 120, the harmonic termination circuit 30B is disposed symmetrically to the harmonic termination circuit 30A with respect to the center line 160. That is, the harmonic termination circuit 30B is formed in the vicinity of the center line 160 on the negative side of the Y axis with respect to the region 161B. The harmonic termination circuit 30B includes a terminator 140B (second terminator). The terminator 140B and the plural output terminals 130B are arranged side by side in the second path 1B.

The capacitor 31B is connected at one end to one of the plural output terminals 130B (output terminal closest to the center line 160 in FIG. 5) and at the other end to the terminator 140B. The inductor 32B is connected at one end to the terminator 140B and at the other end to the ground portion 111 on the substrate 110. The inductor 32B is constituted by a wire 141B (second wire) having inductance components.

In this modified example, in a plan view of the semiconductor chip 120, the ground wire 151 is disposed between the wire 141A and the wire 141B. The wire 141A, the ground wire 151, and the wire 141B extend in parallel with each other along the Y axis. The length in the extending direction of the ground wire 151 is preferably longer than the lengths in the extending direction of the wires 141A and 141B. The ground wire 151 is thus able to separate the wires 141A and 141B from each other while keeping a ground potential so as to reduce coupling between the wires 141A and 141B. In the semiconductor apparatus 200, it is thus possible to reduce a leakage of harmonic components from the second path 1B to the first path 1A, as well as from the first path 1A to the second path 1B. As a result, it is possible to reduce the degradation of the power amplification characteristics and the receive sensitivity both in the first and second paths 1A and 1B. The length in the extending direction of the ground wire 151 may be shorter than that of one of the wires 141A and 141B.

In the semiconductor apparatus 200, the wires 141A and 141B may not necessarily be disposed in parallel with each other. If the wires 141A and 141B are disposed in parallel with each other, the coupling degree therebetween becomes greater so as to increase a leakage of harmonic components between the first and second paths 1A and 1B. Accordingly, the effect of providing the ground wire 151 is further enhanced.

The harmonic termination circuits 30A and 30B may not necessarily be disposed symmetrically to each other with respect to the center line 160. In the first embodiment and the modified example thereof, one harmonic termination circuit is provided in each of the first and second paths 1A and 1B. However, two harmonic termination circuits may be provided in each path. In this case, two harmonic termination circuits may be disposed at both ends of the plural output terminals 130A and at both ends of the plural output terminals 130B in the X-axis direction.

In the above-described semiconductor apparatuses 100 and 200, the ends of the wires 141A and 141B opposite the ends connected to the terminators 140A and 140B and the end of the ground wire 151 opposite the end connected to the ground terminal 150 may be connected to the same ground electrode or different ground electrodes on the substrate 110.

Although each of the above-described semiconductor apparatuses 100 and 200 includes the single ground wire 151, it may include two or more ground wires.

Figure 6:
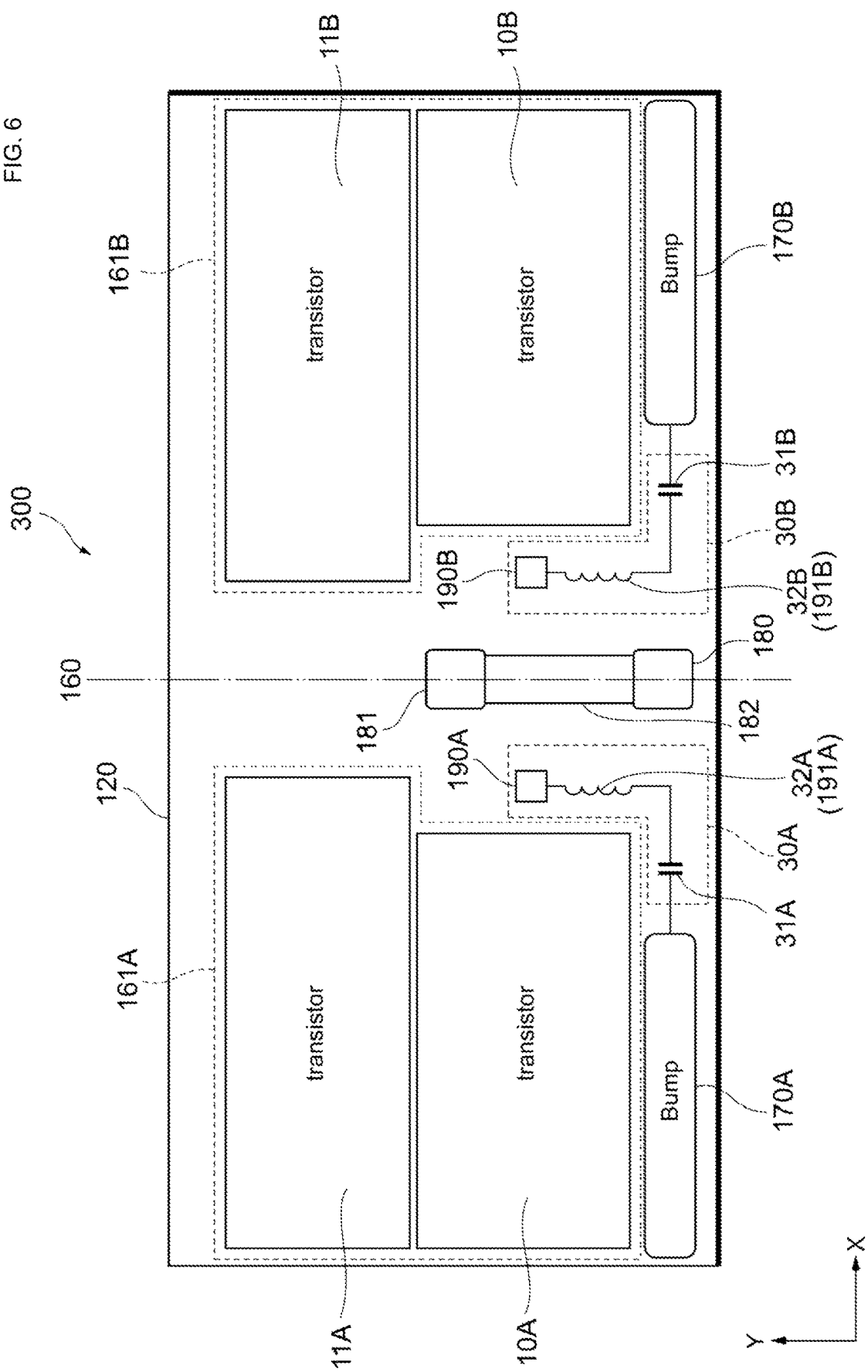
FIG. 6 is a schematic plan view of a semiconductor apparatus according to a second embodiment of the disclosure.

FIG. 6 is a schematic plan view of a semiconductor apparatus 300 according to a second embodiment. The semiconductor apparatus 300 in FIG. 6 is different from the above-described semiconductor apparatuses 100 and 200 in that the semiconductor chip 120 is mounted on the substrate 110 by flip-chip mounting. In FIGS. 6 and 7, the substrate 110 is not shown.

The semiconductor apparatus 300 is different from the semiconductor apparatus 200 in that it includes bumps 170A and 170B instead of the output terminals 130A and 130B and also includes ground bumps 180 and 181 and a ground wiring 182 instead of the ground terminal 150 and the ground wire 151.

The bump 170A (first output terminal) and the bump 170B (second output terminal) are arranged near one side of the semiconductor chip 120 on the negative side of the Y axis. In a plan view of the semiconductor chip 120, the bumps 170A and 170B are formed in a substantially rectangular shape extending along the X axis. The collector of the transistor 10A is electrically connected to the bump 170A, while the collector of the transistor 10B is electrically connected to the bump 170B. With this configuration, the amplified signal RFoutA of a low band is output from the bump 170A, while the amplified signal RFoutB of a middle band is output from the bump 170B. The bumps 170A and 170B may be constituted by cupper pillar bumps, though they are not restricted to this type of bump. Other bumps, which will be discussed below, may also be formed in a similar manner.

The harmonic termination circuit 30A is connected at one end to the bump 170A and at the other end to a bump 190A. The harmonic termination circuit 30B is connected at one end to the bump 170B and at the other end to a bump 190B. The bumps 190A and 190B are a specific example of ground portions provided on the semiconductor chip 120. When the semiconductor chip 120 is mounted on the substrate 110 (not shown), the bumps 190A and 190B are electrically connected to a ground portion on the substrate 110 so as to receive a ground potential. In the second embodiment, the inductor 32A included in the harmonic termination circuit 30A is constituted by a wiring 191A (first wiring) within the semiconductor chip 120. The inductor 32B included in the harmonic termination circuit 30B is constituted by a wiring 191B (second wiring) within the semiconductor chip 120. The wirings 191A and 191B are merely represented by a symbol in FIG. 6, but they are formed to extend in parallel with each other along the Y axis.

The ground bumps 180 and 181 and the ground wiring 182 correspond to the conductive portion W shown in FIG. 4 and has a shielding function, as in the ground wire 151 shown in FIG. 5. This will be described more specifically. The ground bumps 180 and 181 are arranged between the regions 161A and 161B along the center line 160. When the semiconductor chip 120 is mounted on the substrate 110 (not shown), the ground bumps 180 and 181 are electrically connected to the ground portion on the substrate 110 so as to receive a ground potential. The ground wiring 182 extends along the Y axis so as to electrically connect the ground bumps 180 and 181. In a plan view of the semiconductor chip 120, the ground wiring 182 is disposed between the wiring 191A forming the inductor 32A and the wiring 191B forming the inductor 32B so as to be parallel with the wirings 191A and 191B. The length in the extending direction of the ground wiring 182 is preferably longer than that of the wirings 191A and 191B. This can make the ground wiring 182 and the ground bumps 180 and 181 serve the function of shielding the wirings 191A and 191B from each other so as to reduce coupling therebetween. The length in the extending direction of the ground wiring 182 may be shorter than that of the wirings 191A and 191B.

With the above-described configuration, the semiconductor apparatus 300 achieves advantages similar to those of the semiconductor apparatus 200. In the second embodiment, the wirings 191A and 191B are connected to a ground electrode on the substrate 110 via the bumps 190A and 190B, instead of on the semiconductor chip 120. For example, if the substrate 110 is constituted by a multilayer substrate, the wirings 191A and 191B may be electrically connected to the same ground electrode on a layer relatively separated from the semiconductor chip 120. The ground electrode to which the wirings 191A and 191B are electrically connected on the substrate 110 and the ground electrode to which the ground bumps 180 and 181 are electrically connected on the substrate 110 may be the same ground electrode or different ground electrodes. The ends of the wirings 191A and 191B opposite the ends connected to the capacitors 31A and 31B may not be connected to the bumps 190A and 190B, but be connected to bumps (not shown) to which the emitters of the transistors 10A and 10B are connected.

FIG. 7 is a schematic plan view of a semiconductor apparatus 400 according to a modified example of the second embodiment. The semiconductor apparatus 400 is different from the semiconductor apparatus 300 in that it includes one ground bump 183 instead of the two ground bumps 180 and 181 and the ground wiring 182.

The ground bump 183 is a specific example of a conductive portion having a shielding function similar to that of the ground wire 151 shown in FIG. 5. The ground bump 183 is disposed between the regions 161A and 161B to extend along the center line 160. The ground bump 183 is formed in a substantially rectangular shape, in a plan view of the semiconductor chip 120. When the semiconductor chip 120 is mounted on the substrate 110 (not shown), the ground bump 183 is connected to a terminal on the substrate 110 so as to receive a ground potential. In a plan view of the semiconductor chip 120, the ground bump 183 is disposed between the wirings 191A and 191B so as to be parallel with them. The length in the extending direction of the ground bump 183 is preferably longer than that of the wirings 191A and 191B. However, it may be shorter than that of the wirings 191A and 191B.

In this manner, the conductive portion having a shielding function may be constituted by the single ground bump 183 instead of a combination of bumps and a wiring. With this configuration, too, the semiconductor apparatus 400 achieves advantages similar to those of the semiconductor apparatus 300.

In the above-described semiconductor apparatuses 300 and 400, the first and second paths 1A and 1B respectively include the harmonic termination circuits 30A and 30B. However, the semiconductor apparatuses 300 and 400 may each include only one of the harmonic termination circuits 30A and 30B. If the semiconductor apparatus 300 or 400 has the harmonic termination circuit 30A, the ground wiring 182 or the ground bump 183 may be disposed between the wiring 191A and the bump 170B.

As well as in the semiconductor apparatuses 100 and 200, in the semiconductor apparatuses 300 and 400, the wires 191A and 191B may not necessarily be disposed in parallel with each other.

Although, in the semiconductor apparatuses 300 and 400, the wirings 191A and 191B are connected to the different bumps 190A and 190B, they may be connected to the same bump.

The semiconductor apparatuses 300 and 400 respectively include one ground wiring 182 and one ground bump 183 as a conductive portion having a ground potential. However, each of the semiconductor apparatuses 300 and 400 may include two or more conductive portions.

The embodiments of the disclosure have been discussed above by way of examples. The semiconductor apparatuses 100 and 200 each includes the substrate 110, the semiconductor chip 120, first and second amplifiers, a first harmonic termination circuit, and the ground wire 151. The substrate 110 includes the ground portion 111 to which a ground potential is supplied. The semiconductor chip 120 is mounted on the substrate 110 and includes first and second output terminals, a first terminator, and a ground terminal. The first amplifier is formed in a first region of the semiconductor chip 120 and amplifies a first input signal of a first frequency band and outputs a first amplified signal from the first output terminal via a first output wire. The second amplifier is formed in a second region of the semiconductor chip 120 and amplifies a second input signal of a second frequency band and outputs a second amplified signal from the second output terminal via a second output wire. The first harmonic termination circuit has frequency characteristics in which harmonic components contained in the first amplified signal are attenuated. The first harmonic termination circuit includes a first wire which electrically connects the first terminator of the semiconductor chip 120 and the ground portion 111 of the substrate 110. The ground wire 151 is disposed between the first wire and the second output wire in a plan view of the main surface 121 of the semiconductor chip 120 and electrically connects the ground terminal of the semiconductor chip 120 and the ground portion 111 of the substrate 110. With this configuration, in the semiconductor apparatuses 100 and 200, coupling between the first wire of the first harmonic termination circuit and the second output wire is decreased. It is thus possible to reduce a leakage of harmonic components from the first wire to the second output wire, thereby making it less likely to cause interference of signals between plural amplification paths.

In each of the semiconductor apparatuses 100 and 200, the ground wire 151 and the first wire may extend in parallel with each other. The length in the extending direction of the ground wire 151 may be longer than that of the first wire. The ground wire 151 is thus able to separate the first wire and the second output wire from each other so as to reduce coupling therebetween.

In the semiconductor apparatus 200, the semiconductor chip 120 may further include a second terminator. The semiconductor apparatus 200 may further include a second harmonic termination circuit. The second harmonic termination circuit has frequency characteristics in which harmonic components contained in the second amplified signal are attenuated. The second harmonic termination circuit includes a second wire which electrically connects the second terminator of the semiconductor chip 120 and the ground portion 111 of the substrate 110. The ground wire 151 is disposed between the first and second wires in a plan view of the main surface 121 of the semiconductor chip 120. This can reduce a leakage of harmonic components from the second path 1B to the first path 1A, as well as from the first path 1A to the second path 1B. It is thus possible to make it less likely to cause interference of signals among plural amplification paths in multiple directions.

In the semiconductor apparatus 200, the ground wire 151 and the second wire may extend in parallel with each other. The length in the extending direction of the ground wire 151 may be longer than that of the second wire. The ground wire 151 is thus able to separate the second wire and the first output wire from each other so as to reduce coupling therebetween.

The semiconductor apparatuses 300 and 400 each includes the semiconductor chip 120, first and second amplifiers, a first harmonic termination circuit, and a conductive portion. The semiconductor chip 120 includes first and second output terminals and a ground portion. A ground potential is supplied to the ground portion. The first amplifier is formed in a first region of the semiconductor chip 120 and amplifies a first input signal of a first frequency band and outputs a first amplified signal from the first output terminal. The second amplifier is formed in a second region of the semiconductor chip 120 and amplifies a second input signal of a second frequency band and outputs a second amplified signal from the second output terminal. The first harmonic termination circuit has frequency characteristics in which harmonic components contained in the first amplified signal are attenuated. The first harmonic termination circuit includes a first wiring which electrically connects the first output terminal and the ground portion of the semiconductor chip 120. The conductive portion is disposed between the first wiring and the second output terminal in a plan view of the main surface 121 of the semiconductor chip 120. A ground potential is supplied to the conductive portion. With this configuration, in the semiconductor apparatuses 300 and 400, coupling between the first wiring of the first harmonic termination circuit and the second output terminal is decreased. It is thus possible to reduce a leakage of harmonic components from the first wiring to the second output terminal, thereby making it less likely to cause interference of signals between plural amplification paths.

In each of the semiconductor apparatuses 300 and 400, the conductive portion and the first wiring may extend in parallel with each other. The length in the extending direction of the conductive portion may be longer than that of the first wiring. The conductive portion is thus able to separate the first wiring and the second output terminal from each other so as to reduce coupling therebetween.

The semiconductor apparatuses 300 and 400 may each include a second harmonic termination circuit. The second harmonic termination circuit has frequency characteristics in which harmonic components contained in the second amplified signal are attenuated. The second harmonic termination circuit includes a second wiring which electrically connects the second output terminal of the semiconductor chip 120 and the ground portion. The conductive portion may be disposed between the first and second wirings in a plan view of the main surface 121 of the semiconductor chip 120. It is thus possible to make it less likely to cause interference of signals among plural amplification paths in multiple directions.

The configuration of the conductive portion is not restricted to a particular configuration. The conductive portion may include plural bumps and a wiring which electrically connects the plural bumps, as in the semiconductor apparatus 300. Alternatively, the conductive portion may be constituted by one bump, as in the semiconductor apparatus 400.

The above-described embodiments are provided for facilitating the understanding of the disclosure, but are not intended to be exhaustive or to limit the disclosure to the precise forms disclosed. Modifications and/or improvements may be made without departing from the scope and spirit of the disclosure, and equivalents of the disclosure are also encompassed in the disclosure. That is, suitable design changes made to the embodiments by those skilled in the art are also encompassed in the disclosure within the scope and spirit of the disclosure. For example, the elements of the embodiments and the positions, materials, conditions, configurations, and sizes thereof are not restricted to those described in the embodiments and may be changed in an appropriate manner. The elements of the embodiments may be combined within a technically possible range, and configurations obtained by combining the elements of the embodiments are also encompassed in the disclosure within the scope and spirit of the disclosure.

While preferred embodiments of the disclosure have been described above, it is to be understood that variations and modifications will be apparent to those skilled in the art without departing from the scope and spirit of the disclosure. The scope of the disclosure, therefore, is to be determined solely by the following claims.

What is claimed is:

1. A semiconductor apparatus comprising:
    a substrate including a ground portion to which a ground potential is supplied;
    a semiconductor chip that is mounted on the substrate and that comprises first and second output terminals, a first terminator, and a ground terminal;
    a first amplifier that is part of the semiconductor chip and that is configured to amplify a first input signal of a first frequency band and to output a first amplified signal from the first output terminal via a first output wire;
    a second amplifier that is part of the semiconductor chip and that is configured to amplify a second input signal of a second frequency band and to output a second amplified signal from the second output terminal via a second output wire;
    a first harmonic termination circuit configured to attenuate harmonic components contained in the first amplified signal and that comprises a first wire that electrically connects the first terminator of the semiconductor chip with the ground portion of the substrate; and
    a ground wire that electrically connects the ground terminal of the semiconductor chip with the ground portion of the substrate,
    wherein, as viewed in a plan view, the ground wire is disposed between the first wire and the second output wire.

2. The semiconductor apparatus according to claim 1, wherein:
    the ground wire and the first wire extend in parallel with each other; and
    the ground wire is longer than the first wire.

3. The semiconductor apparatus according to claim 1, wherein the semiconductor chip further comprises a second terminator,
    wherein the semiconductor apparatus further comprises a second harmonic termination circuit configured to terminate harmonic components contained in the second amplified signal and that comprises a second wire that electrically connects the second terminator of the semiconductor chip with the ground portion of the substrate, and
    wherein, as viewed in the plan view, the ground wire is disposed between the first wire and the second wire.

4. The semiconductor apparatus according to claim 2, wherein the semiconductor chip further comprises a second terminator,
    wherein the semiconductor apparatus further comprises a second harmonic termination circuit configured to terminate harmonic components contained in the second amplified signal and that comprises a second wire that electrically connects the second terminator of the semiconductor chip with the ground portion of the substrate, and
    wherein, as viewed in the plan view, the ground wire is disposed between the first wire and the second wire.

5. The semiconductor apparatus according to claim 3, wherein:
    the ground wire and the second wire extend in parallel with each other; and
    the ground wire is longer than the second wire.

6. The semiconductor apparatus according to claim 4, wherein:
    the ground wire and the second wire extend in parallel with each other; and
    the ground wire is longer than the second wire.

7. A semiconductor apparatus comprising:
    a semiconductor chip that comprises first and second output terminals and a ground portion, a ground potential being supplied to the ground portion;
    a first amplifier that is formed as part of the semiconductor chip and that is configured to amplify a first input signal of a first frequency band and to output a first amplified signal from the first output terminal;
    a second amplifier that is formed as part of the semiconductor chip and that is configured to amplify a second input signal of a second frequency band and to output a second amplified signal from the second output terminal;
    a first harmonic termination circuit configured to attenuate harmonic components contained in the first amplified signal and that comprises a first wiring that electrically connects the first output terminal with the ground portion of the semiconductor chip; and
    a conductive portion supplied with the ground potential,
    wherein as viewed in a plan view, the conductive portion is disposed between the first wiring and the second output terminal.

8. The semiconductor apparatus according to claim 7, wherein:
    the conductive portion and the first wiring extend in parallel with each other; and
    the conductive portion is longer than the first wiring.

9. The semiconductor apparatus according to claim 7, further comprising:
    a second harmonic termination circuit configured to attenuate harmonic components contained in the second amplified signal and that comprises a second wiring that electrically connects the second output terminal of the semiconductor chip with the ground portion,
    wherein, as viewed in the plan view, the conductive portion is disposed between the first wiring and the second wiring.

10. The semiconductor apparatus according to claim 8, further comprising:
    a second harmonic termination circuit configured to attenuate harmonic components contained in the second amplified signal and that comprises a second wiring that electrically connects the second output terminal of the semiconductor chip with the ground portion, wherein, as viewed in the plan view, the conductive portion is disposed between the first wiring and the second wiring.

11. The semiconductor apparatus according to claim 7, wherein the conductive portion comprises a plurality of bumps and a wiring that electrically connects the plurality of bumps, and wherein, as viewed in the plan view, the plurality of bumps are disposed between the first amplifier and the second amplifier.

12. The semiconductor apparatus according to claim 8, wherein the conductive portion comprises a plurality of bumps and a wiring that electrically connects the plurality of bumps, and wherein, as viewed in the plan view, the plurality of bumps are disposed between the first amplifier and the second amplifier.

13. The semiconductor apparatus according to claim 9, wherein the conductive portion comprises a plurality of bumps and a wiring that electrically connects the plurality of bumps, and wherein, as viewed in the plan view, the plurality of bumps are disposed between the first amplifier and the second amplifier.

14. The semiconductor apparatus according to claim 7, wherein the conductive portion comprises a bump, and wherein, as viewed in the plane view, the bump is disposed between the first amplifier and the second amplifier.

15. The semiconductor apparatus according to claim 8, wherein the conductive portion comprises a bump, and wherein, as viewed in the plane view, the bump is disposed between the first amplifier and the second amplifier.

16. The semiconductor apparatus according to claim 9, wherein the conductive portion comprises a bump, and wherein, as viewed in the plane view, the bump is disposed between the first amplifier and the second amplifier.

* * * * *